(12) United States Patent
Kim

(10) Patent No.: US 12,246,640 B2
(45) Date of Patent: Mar. 11, 2025

(54) LAMP FOR VEHICLE AND VEHICLE INCLUDING THE SAME

(71) Applicant: HYUNDAI MOBIS CO., LTD., Seoul (KR)

(72) Inventor: Myeong Je Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 11 days.

(21) Appl. No.: 17/562,812

(22) Filed: Dec. 27, 2021

(65) Prior Publication Data

US 2022/0219598 A1    Jul. 14, 2022

(30) Foreign Application Priority Data

Jan. 8, 2021  (KR) .................. 10-2021-0002816

(51) Int. Cl.

| | |
|---|---|
| *B60Q 1/16* | (2006.01) |
| *B60Q 1/14* | (2006.01) |
| *F21S 41/153* | (2018.01) |
| *F21W 102/00* | (2018.01) |
| *F21Y 115/10* | (2016.01) |
| *H01L 25/16* | (2023.01) |
| *H05B 45/44* | (2020.01) |

(52) U.S. Cl.
CPC .............. *B60Q 1/16* (2013.01); *B60Q 1/1407* (2013.01); *F21S 41/153* (2018.01); *H05B 45/44* (2020.01); *B60Q 2300/056* (2013.01); *B60Q 2300/42* (2013.01); *F21W 2102/00* (2018.01); *F21Y 2115/10* (2016.08); *H01L 25/167* (2013.01)

(58) Field of Classification Search
CPC ........ H05B 45/20; H05B 45/10; H05B 33/12; H05B 33/14; H05B 45/42
See application file for complete search history.

(56) References Cited

U.S. PATENT DOCUMENTS

| | | | | |
|---|---|---|---|---|
| 2015/0195874 A1* | 7/2015 | Kang | ............... | H05B 45/48 |
| | | | | 315/192 |
| 2016/0381750 A1* | 12/2016 | Bong | ............... | H01L 25/167 |
| | | | | 315/201 |
| 2020/0187327 A1* | 6/2020 | Ichikawa | ............ | B60Q 1/1415 |
| 2021/0315081 A1* | 10/2021 | Daroussin | ............ | H05B 45/44 |

* cited by examiner

*Primary Examiner* — Wei (Victor) Y Chan
(74) *Attorney, Agent, or Firm* — DLA Piper LLP US

(57) ABSTRACT

A lamp for a vehicle and a vehicle including the same. One aspect provides a lamp for a vehicle, the lamp including: a first circuit configured to connect, in series, a plurality of LEDs disposed in first and second LED groups; and a second circuit branching off from the first circuit and connected to FET elements disposed in a matrix IC unit, in which the first circuit includes: a first region configured to connect two LEDs respectively disposed in the first and second LED groups and spaced apart from each other in a second direction; and a second region configured to connect two LEDs respectively disposed in the first and second LED groups and spaced apart from each other in a direction intersecting a first direction and the second direction.

7 Claims, 5 Drawing Sheets

LAMP FOR VEHICLE AND VEHICLE INCLUDING THE SAME

CROSS-REFERENCE TO RELATED APPLICATION

This application claims priority to and the benefit of Korean Patent Application No. 10-2021-0002816 filed in the Korean Intellectual Property Office on Jan. 8, 2021, the entire contents of which are incorporated herein by reference.

TECHNICAL FIELD

The present disclosure relates to a lamp for a vehicle including a plurality of light sources and a vehicle including the same.

BACKGROUND ART

An adaptive driving beam (ADB) lamp mounted on a vehicle has a shape evolved from a high-beam lamp in the related art. When an oncoming vehicle is present in front of a host vehicle, the ADB lamp forms a dark zone on a part of a beam pattern by turning off a light source for emitting light to a region in which the oncoming vehicle is present, thereby preventing light blindness of a driver in the oncoming vehicle.

The ADB lamp is mounted with a plurality of LEDs and may form the partial dark zone by individually controlling operations of turning off the plurality of LEDs.

Meanwhile, the number of LEDs mounted in the ADB lamp needs to increase to precisely control the dark zone formed on the beam pattern formed by the ADB lamp. However, the increase in number of LEDs also complicates a structure of the lamp for a vehicle in which the LEDs are mounted. Therefore, it is necessary to optimize the arrangement of LEDs and circuits to develop the ADB lamp having a large number of LEDs.

SUMMARY

The present disclosure has been made in an effort to simplify a structure of a lamp for a vehicle by optimizing arrangement of LEDs and circuits in the lamp for a vehicle in which a plurality of LEDs is mounted and operations of turning on the LEDs are individually controlled.

A first aspect of the present disclosure provides a lamp for a vehicle, the lamp including: a first LED group including a plurality of LEDs disposed to be spaced apart from one another in a first direction D1; a second LED group spaced apart from the first LED group in a second direction D2 intersecting the first direction D1 and including a plurality of LEDs disposed to be spaced apart from one another in the first direction D1; a matrix IC unit spaced apart from the first LED group in the second direction D2 and including a plurality of FET elements; a first circuit configured to connect, in series, the plurality of LEDs disposed in the first and second LED groups; and second circuits branching off from the first circuit and connected to the FET elements provided in the matrix IC unit, in which the first circuit includes: a first region configured to connect two LEDs respectively disposed in the first and second LED groups and spaced apart from each other in the second direction D2; and a second region configured to connect two LEDs respectively disposed in the first and second LED groups and spaced apart from each other in a direction intersecting the first direction D1 and the second direction D2.

The second circuits may branch off from the first and second regions and connect, in a one-to-one manner, the first and second regions to the plurality of FET elements provided in the matrix IC unit.

The first circuit may include a section in which the first and second regions are alternately disposed.

The lamp may further include: an additional LED group including one or more LEDs and disposed to be spaced apart from the first LED group in the first direction D1; and an additional circuit configured to connect the additional LED group and the first LED group in series.

The additional LED group may include a plurality of LEDs disposed to be spaced apart from one another in the first direction D1, and the additional circuit may connect, in series, the plurality of LEDs disposed in the additional LED group.

A second aspect of the present disclosure provides a lamp for a vehicle, the lamp including: a first LED group including a plurality of LEDs disposed to be spaced apart from one another in a first direction D1; a second LED group spaced apart from the first LED group in a second direction D2 intersecting the first direction D1 and including a plurality of LEDs disposed to be spaced apart from one another in the first direction D1; a third LED group spaced apart from the second LED group in the second direction D2 and including a plurality of LEDs disposed to be spaced apart from one another in the first direction D1; a matrix IC unit spaced apart from the first to third LED groups in the second direction D2 and including a plurality of FET elements; a first circuit configured to connect, in series, the plurality of LEDs disposed in the first and second LED groups; second circuits branching off from the first circuit and connected to the FET elements provided in the matrix IC unit; a third circuit configured to connect, in series, the plurality of LEDs disposed in the third LED group; and fourth circuits branching off from the third circuit and connected to the FET elements provided in the matrix IC unit, in which the first circuit includes: a first region configured to connect two LEDs respectively disposed in the first and second LED groups and spaced apart from each other in the second direction D2; and a second region configured to connect two LEDs respectively disposed in the first and second LED groups and spaced apart from each other in a direction intersecting the first direction D1 and the second direction D2.

The matrix IC unit may include: a first matrix IC spaced apart from the first LED group in a direction opposite to a direction in which the first LED group faces the second LED group; and a second matrix IC spaced apart from the third LED group in a direction opposite to a direction in which the third LED group faces the second LED group, the second circuits may be connected to the FET elements provided in the first matrix IC, and the fourth circuits may be connected to the FET elements provided in the second matrix IC.

A third aspect of the present disclosure provides a lamp for a vehicle, the lamp including: a first LED group including a plurality of LEDs disposed to be spaced apart from one another in a first direction D1; a second LED group spaced apart from the first LED group in a second direction D2 intersecting the first direction D1 and including a plurality of LEDs disposed to be spaced apart from one another in the first direction D1; a third LED group spaced apart from the second LED group in the second direction D2 and including a plurality of LEDs disposed to be spaced apart from one another in the first direction D1; a fourth LED group spaced apart from the third LED group in the second direction D2 and including a plurality of LEDs disposed to be spaced apart from one another in the first direction D1; a matrix IC unit spaced apart from the first to fourth LED groups in the second direction D2 and including a plurality of FET elements; a first circuit configured to connect, in series, the plurality of LEDs disposed in the first and second LED groups; second circuits branching off from the first circuit and connected to the FET elements provided in the matrix IC unit; a third circuit configured to connect, in series, the plurality of LEDs disposed in the third and fourth LED groups; and fourth circuits branching off from the third circuit and connected to the FET elements provided in the matrix IC unit, in which the first circuit includes: a first region configured to connect two LEDs respectively disposed in the first and second LED groups and spaced apart from each other in the second direction D2; and a second region configured to connect two LEDs respectively disposed in the first and second LED groups and spaced apart from each other in a direction intersecting the first direction D1 and the second direction D2.

The matrix IC unit may include: a first matrix IC spaced apart from the first LED group in a direction opposite to a direction in which the first LED group faces the second LED group; and a second matrix IC spaced apart from the third LED group in a direction opposite to a direction in which the third LED group faces the fourth LED group, the second circuits may be connected to the FET elements provided in the first matrix IC, and the fourth circuits may be connected to the FET elements provided in the second matrix IC.

The third circuit may include: a third region configured to connect two LEDs respectively disposed in the third and fourth LED groups and spaced apart from each other in the second direction D2; and a fourth region configured to connect two LEDs respectively disposed in the third and fourth LED groups and spaced apart from each other in the direction intersecting the first direction D1 and the second direction D2.

A fourth aspect of the present disclosure provides a vehicle including a lamp for a vehicle, in which the lamp for a vehicle includes: a first LED group including a plurality of LEDs disposed to be spaced apart from one another in a first direction D1; a second LED group spaced apart from the first LED group in a second direction D2 intersecting the first direction D1 and including a plurality of LEDs disposed to be spaced apart from one another in the first direction D1; a matrix IC unit spaced apart from the first LED group in the second direction D2 and including a plurality of FET elements; a first circuit configured to connect, in series, the plurality of LEDs disposed in the first and second LED groups; and second circuits branching off from the first circuit and connected to the FET elements provided in the matrix IC unit, and in which the first circuit includes: a first region configured to connect two LEDs respectively disposed in the first and second LED groups and spaced apart from each other in the second direction D2; and a second region configured to connect two LEDs respectively disposed in the first and second LED groups and spaced apart from each other in a direction intersecting the first direction D1 and the second direction D2.

The lamp for a vehicle may be an adaptive driving beam (ADB) lamp.

According to the present disclosure, it is possible to simplify the structure of the lamp for a vehicle by optimizing the arrangement of the LEDs and the circuits in the lamp for a vehicle in which the plurality of LEDs is mounted and the operations of turning on the LEDs are individually controlled.

DETAILED DESCRIPTION

Hereinafter, a lamp for a vehicle and a vehicle according to the present disclosure will be described with reference to the drawings.

Lamp for Vehicle

Figure 1:
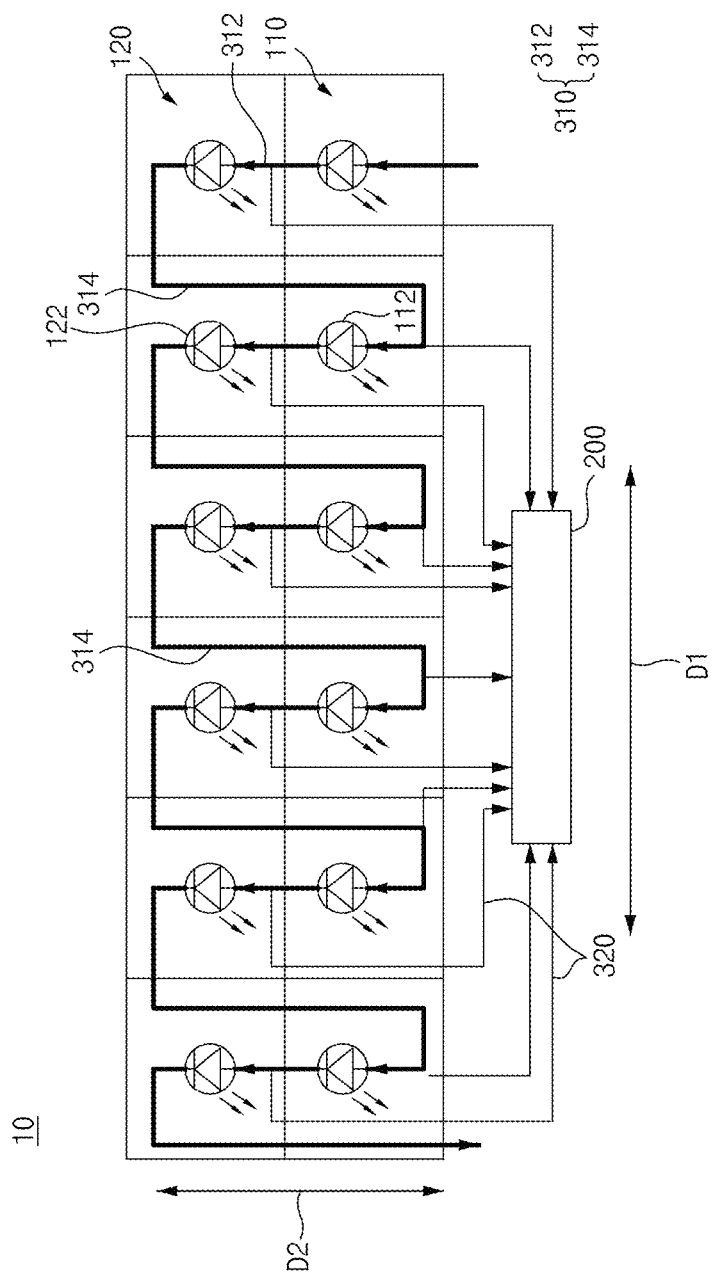
FIG. 1 is a view illustrating a structure of a lamp for a vehicle according to a first embodiment of the present disclosure.

FIG. 1 is a view illustrating a structure of a lamp for a vehicle according to a first embodiment of the present disclosure.

As illustrated in FIG. 1, a lamp 10 for a vehicle according to the present disclosure may include a first LED group 110 including a plurality of LEDs disposed to be spaced apart from one another in a first direction D1. FIG. 1 illustrates an example in which the first LED group includes six LEDs disposed to be spaced apart from one another at an equal interval in the first direction D1. However, the number of LEDs disposed in the first LED group 110 is not limited to the number of LEDs illustrated in the drawing. In the drawing, reference numeral 112 is assigned to the LED disposed in the first LED group 110.

In addition, the lamp 10 for a vehicle may include a second LED group 120 spaced apart from the first LED group 110 in a second direction D2 that perpendicularly intersects the first direction D1, and the second LED group 120 may include a plurality of LEDs disposed to be spaced apart from one another in the first direction D1. FIG. 1 illustrates an example in which the second LED group 120 includes six LEDs disposed to be spaced apart from one another at an equal interval in the first direction D1. However, the number of LEDs disposed in the second LED group 120 is not limited to the number of LEDs illustrated in the drawing. In the drawing, reference numeral 122 is assigned to the LED disposed in the second LED group 120.

In addition, the lamp 10 for a vehicle may further include: a matrix IC (integrated circuit) unit 200 spaced apart from the first LED group 110 in the second direction D2 and including a plurality of FET (field effect transistor) elements (not illustrated); a first circuit 310 configured to connect, in series, the plurality of LEDs 112 disposed in the first LED group 110 and the plurality of LEDs 114 disposed in the second LED group 120; and second circuits 320 branching off from the first circuit 310 and connected to the FET elements provided in the matrix IC unit 200.

In this case, according to the present disclosure, the first circuit 310 may include: a first region 312 configured to connect two LEDs 112 and 122 respectively disposed in the first and second LED groups 110 and 120 and spaced apart from each other in the second direction D2; and a second region 314 configured to connect two LEDs 112 and 122 respectively disposed in the first and second LED groups 110 and 120 and spaced apart from each other in the direction that intersects the first direction D1 and the second direction D2. Therefore, according to the present disclosure, the LED 112 disposed in the first LED group 110 and the LED 122 disposed in the second LED group 120 may be connected in series by the first and second regions 312 and 314 that constitute the first circuit 310.

Meanwhile, according to the present disclosure, the second circuits 320 may branch off from the first and second regions 312 and 314 of the first circuit 310 and connect the first and second regions 312 and 314 to the plurality of FET elements in a one-to-one manner. Therefore, according to the first embodiment of the present disclosure, the number of second circuits 320 may be equal to a total sum of the number of first and second regions 312 and 314. For example, as illustrated in FIG. 1, the number of second circuits 320 may be eleven when the number of first regions 312 of the first circuit 310 is six and the number of second regions 314 of the first circuit 310 is five.

Meanwhile, according to the present disclosure, the first circuit 310 may include a section in which the first and second regions 312 and 314 are alternately disposed. More particularly, the first circuit 310 may have a structure in which the first and second regions 312 and 314 are alternately disposed. This structure of the first circuit 310 may serve to connect, in series and in a zigzag manner, the plurality of LEDs 112 disposed in the first LED group 110 and the plurality of LEDs 122 disposed in the second LED group 120.

Meanwhile, according to the first embodiment of the present disclosure, the plurality of LEDs constituting the lamp 10 for a vehicle may be arranged symmetrically in the first direction D1 and the second direction D2. Therefore, the lamp 10 for a vehicle according to the first embodiment of the present disclosure may have a shape symmetric in an upward/downward direction and a leftward/rightward direction.

According to the present disclosure, the plurality of LEDs 112 disposed in the first LED group 110 and the plurality of LEDs 122 disposed in the second LED group 120 may be connected in series by the first circuit 310, and the second circuits 320 branching off from the first circuit 310 may be additionally provided, which makes it possible to individually control the operations of turning on or off the LEDs provided in the lamp 10 for a vehicle.

That is, to turn on a particular LED among the plurality of LEDs provided in the lamp 10 for a vehicle, electric current is supplied to the particular LED through the first or second region 312 or 314 connected to the particular LED and disposed at an upstream side from the particular LED based on a direction in which the electric current flows.

However, to turn off the particular LED, electric current is controlled and supplied to the FET element through the second circuit 320 branching off from the first or second region 312 or 314 connected to the particular LED and disposed at the upstream side from the particular LED. The electric current supplied to the FET element is supplied to the first or second region 312 or 314 disposed at a downstream side from the particular LED, through another second circuit 320 disposed at a downstream side from the FET element. That is, according to the present disclosure, the second circuit 320 may serve to allow the electric current flowing along the first circuit 310 to bypass the LED without passing through the LED.

Figure 2:
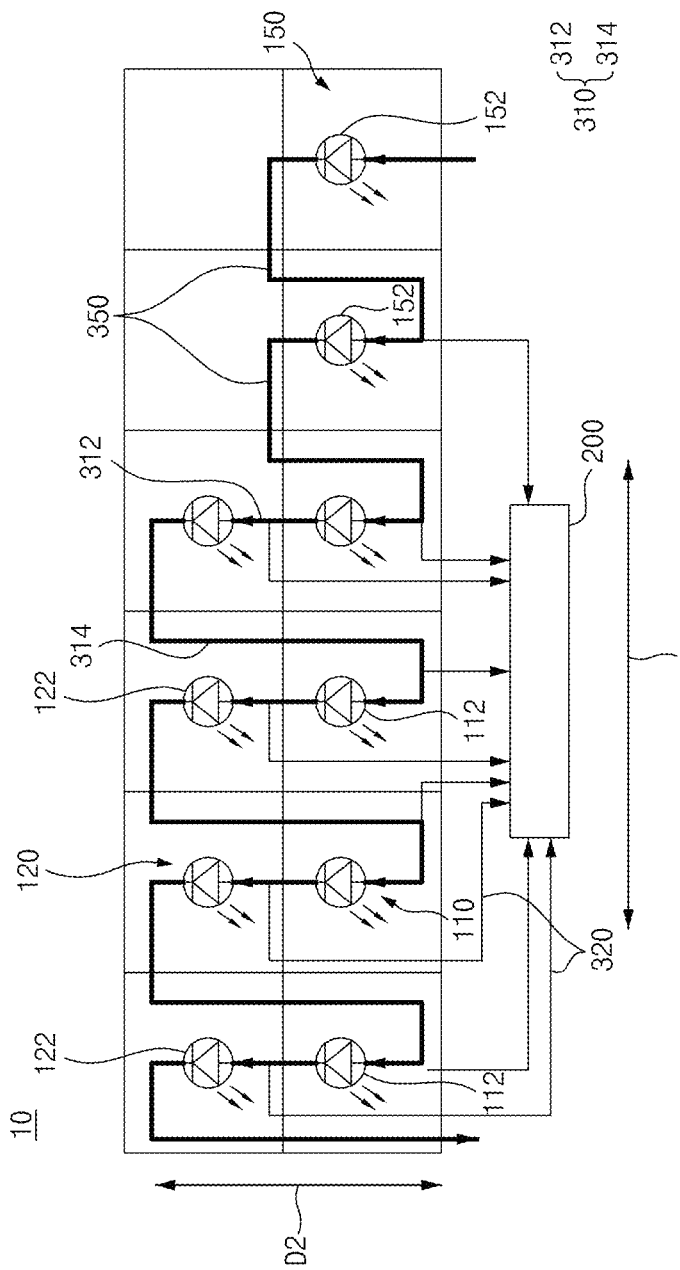
FIG. 2 is a view illustrating a structure of a lamp for a vehicle according to a second embodiment of the present disclosure.

FIG. 2 is a view illustrating a structure of a lamp for a vehicle according to a second embodiment of the present disclosure.

Referring to FIG. 2, a lamp 10 for a vehicle according to the second embodiment of the present disclosure may include: a first LED group 110 including a plurality of LEDs 112; a second LED group 120 including a plurality of LEDs 122; a matrix IC unit 200; a first circuit 310 including first and second regions 312 and 314; and second circuits 320. The aforementioned description of the lamp for a vehicle according to the first embodiment of the present disclosure may also be applied to the lamp for a vehicle according to the second embodiment of the present disclosure. Hereinafter, the lamp for a vehicle according to the second embodiment of the present disclosure will be described focusing on the difference between the first and second embodiments of the present disclosure.

According to the second embodiment of the present disclosure, the lamp 10 for a vehicle may further include: in addition to the first and second LED groups 110 and 120, an additional LED group 150; and an additional circuit 350 configured to connect the additional LED group 150 and the first LED group 110 in series. In more detail, the additional LED group 150 may be disposed at one side of the first LED group 110 in the first direction D1. In the drawing, reference numeral 152 is assigned to the LED disposed in the additional LED group 150. In addition, FIG. 2 illustrates an example in which the additional LED group 150 is disposed at a right side of the first LED group 110 in the first direction D1.

In more detail, according to the second embodiment of the present disclosure, the additional LED group 150 may include a plurality of LEDs 152 disposed to be spaced apart from one another in the first direction D1, and the additional circuit 350 may connect, in series, the plurality of LEDs 152 disposed in the additional LED group 150. However, alternatively, the additional LED group 150 may include only a single LED.

In addition, according to the second embodiment of the present disclosure, the second circuits 320 may branch off from the first and second regions 312 and 314 of the first circuit 310, and the second circuit 320 may also branch off from the additional circuit 350. Therefore, according to the second embodiment of the present disclosure, the second circuit 320 may connect any one of the plurality of FET elements, which is provided in the matrix IC unit 200, to the additional circuit 350 that connects the LEDs 152 in the additional LED group 150. Therefore, according to the second embodiment of the present disclosure, the operations of turning on and off the LEDs 152 disposed in the additional LED group 150 may be controlled individually.

Figure 3:
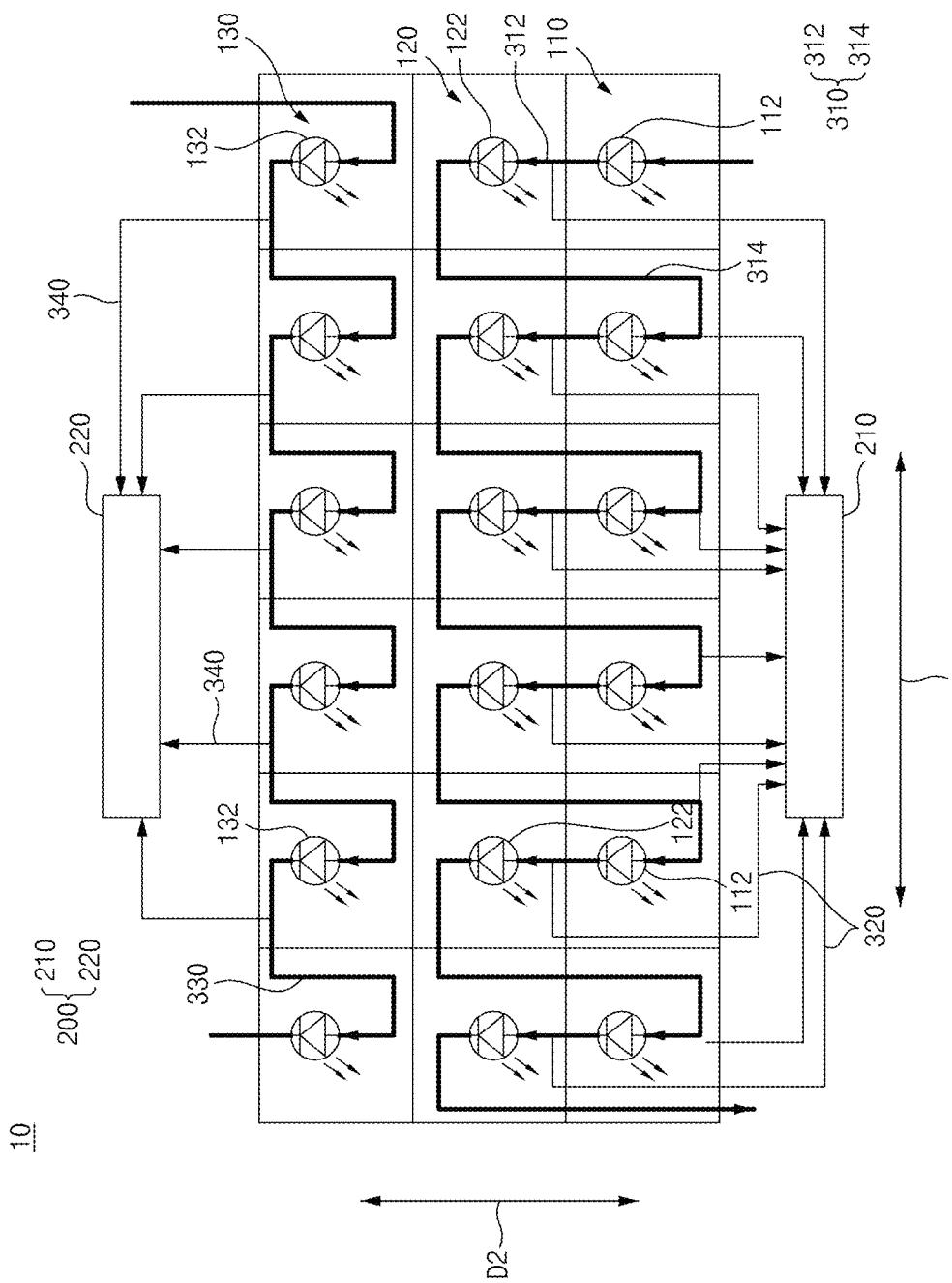
FIG. 3 is a view illustrating a structure of a lamp for a vehicle according to a third embodiment of the present disclosure.

FIG. 3 is a view illustrating a structure of a lamp for a vehicle according to a third embodiment of the present disclosure.

Referring to FIG. 3, a lamp 10 for a vehicle according to a third embodiment of the present disclosure may include: a first LED group 110 including a plurality of LEDs 112 disposed to be spaced apart from one another in a first direction D1; a second LED group 120 spaced apart from the first LED group 110 in a second direction D2 perpendicularly intersecting the first direction D1 and including a plurality of LEDs 122 disposed to be spaced apart from one another in the first direction D1; a third LED group 130 spaced apart from the second LED group 120 in the second direction D2 and including a plurality of LEDs 132 disposed to be spaced apart from one another in the first direction D1; a matrix IC unit 200 spaced apart from the first to third LED groups 110, 120, and 130 in the second direction D2 and including a plurality of FET elements; a first circuit 310 configured to connect, in series, the plurality of LEDs 112 and 122 disposed in the first and second LED groups 110 and 120; second circuits 320 branching off from the first circuit 310 and connected to the FET elements provided in the matrix IC unit 200; third circuits 330 configured to connect, in series, the plurality of LEDs 132 disposed in the third LED group 130; and fourth circuits 340 branching off from the third circuits 330 and connected to the FET elements provided in the matrix IC unit 200.

That is, the lamps 10 for a vehicle according to the first and second embodiments of the present disclosure each have the structure in which the plurality of LEDs is disposed in two rows in the second direction D2, whereas the lamp 10 for a vehicle according to the third embodiment of the present disclosure has the structure in which the plurality of LEDs is disposed in three rows in the second direction D2.

As in the first and second embodiments of the present disclosure, even in the third embodiment of the present disclosure, the first circuit 310 may include: a first region 312 configured to connect two LEDs 112 and 122 respectively disposed in the first and second LED groups 110 and 120 and spaced apart from each other in the second direction D2; and a second region 314 configured to connect two LEDs 112 and 122 respectively disposed in the first and second LED groups 110 and 120 and spaced apart from each other in the direction that intersects the first direction D1 and the second direction D2.

In addition, the fourth circuits 340 may branch off from the plurality of third circuits 330 disposed between the plurality of LEDs 132 disposed in the third LED group 130 and connect the FET elements, provided in the matrix IC unit 200, to the plurality of third circuits 330 in a one-to-one manner.

In addition, according to the third embodiment of the present disclosure, the matrix IC unit 200 may include: a first matrix IC 210 spaced apart from the first LED group 110 in a direction opposite to a direction in which the first LED group 110 faces the second LED group 120; and a second matrix IC 220 spaced apart from the third LED group 130 in the direction opposite to the direction in which the third LED group 130 faces the second LED group 120. In this case, as illustrated in FIG. 3, the second circuits 320 may be connected to the FET elements provided in the first matrix IC 210, and the fourth circuits 340 may be connected to the FET elements provided in the second matrix IC 220.

The description of the method of operating and controlling the lamp for a vehicle according to the third embodiment of the present disclosure may be replaced with the description of the method of operating and controlling the lamp for a vehicle according to the first and second embodiments of the present disclosure.

Figure 4:
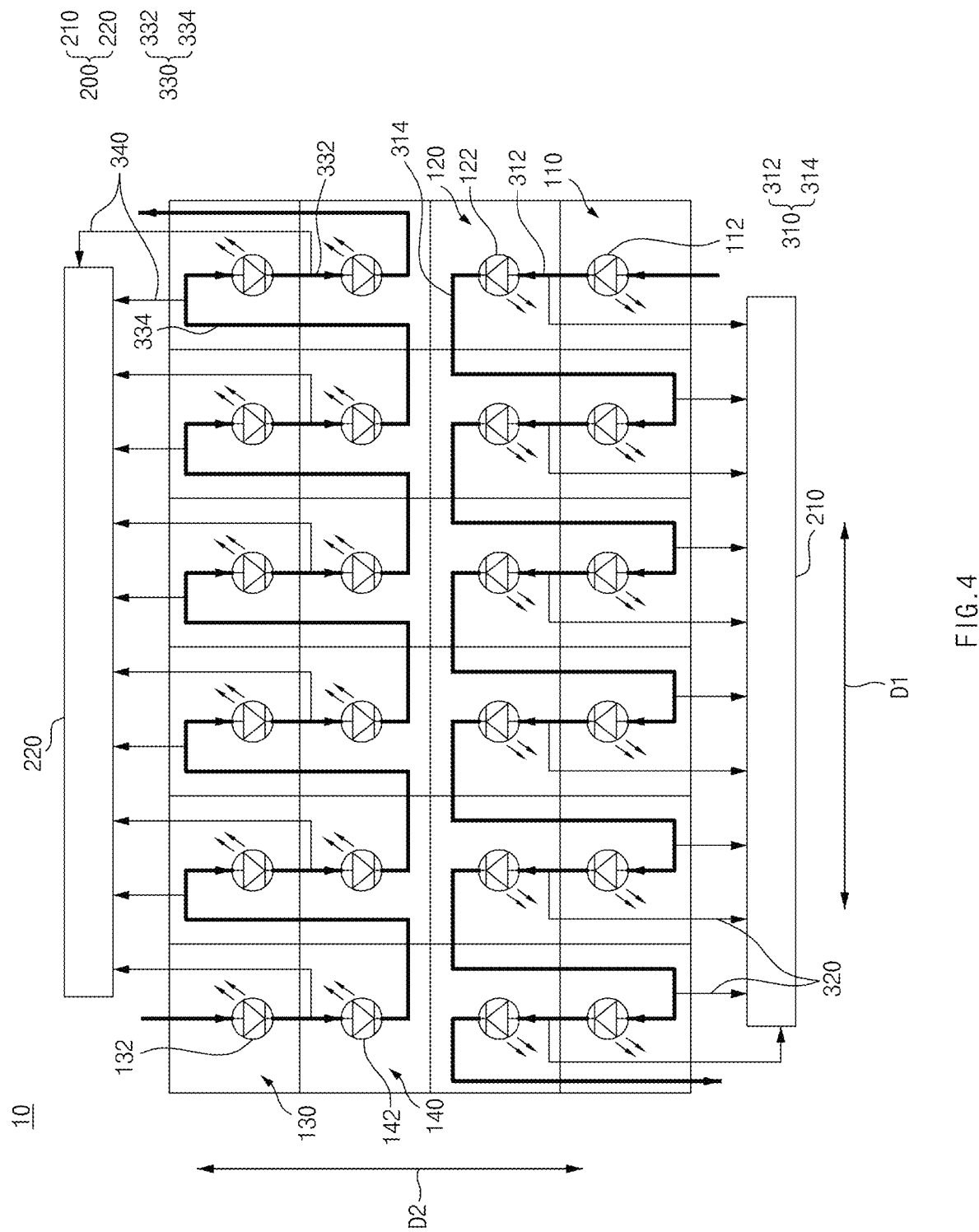
FIG. 4 is a view illustrating a structure of a lamp for a vehicle according to a fourth embodiment of the present disclosure.

FIG. 4 is a view illustrating a structure of a lamp for a vehicle according to a fourth embodiment of the present disclosure.

Referring to FIG. 4, a lamp 10 for a vehicle according to a fourth embodiment of the present disclosure may include: a first LED group 110 including a plurality of LEDs 112 disposed to be spaced apart from one another in a first direction D1; a second LED group 120 spaced apart from the first LED group 110 in a second direction D2 perpendicularly intersecting the first direction D1, and including a plurality of LEDs 122 disposed to be spaced apart from one another in the first direction D1; a third LED group 130 spaced apart from the second LED group 120 in the second direction D2 and including a plurality of LEDs 132 disposed to be spaced apart from one another in the first direction D1; a fourth LED group 140 spaced apart from the third LED group 130 in the second direction D2 and including a plurality of LEDs 142 disposed to be spaced apart from one another in the first direction D1; a matrix IC unit 200 spaced apart from the first to fourth LED groups 110, 120, 130, and 140 in the second direction D2 and including a plurality of FET elements; a first circuit 310 configured to connect, in series, the plurality of LEDs 112 and 122 disposed in the first and second LED groups 110 and 120; second circuits 320 branching off from the first circuit 310 and connected to the FET elements provided in the matrix IC unit 200; a third circuit 330 configured to connect, in series, the plurality of LEDs 132 and 142 disposed in the third and fourth LED groups 130 and 140; and fourth circuits 340 branching off from the third circuit 330 and connected to the FET elements provided in the matrix IC unit 200.

That is, the lamp 10 for a vehicle according to the fourth embodiment of the present disclosure may have the structure in which the plurality of LEDs is disposed in four rows in the second direction D2.

Meanwhile, even in the fourth embodiment of the present disclosure, the first circuit 310 may include: a first region 312 configured to connect two LEDs 112 and 122 respectively disposed in the first and second LED groups 110 and 120 and spaced apart from each other in the second direction D2; and a second region 314 configured to connect two LEDs 112 and 122 respectively disposed in the first and second LED groups 110 and 120 and spaced apart from each other in the direction that intersects the first direction D1 and the second direction D2.

Meanwhile, according to the fourth embodiment of the present disclosure, the third circuit 330 may include: a third region 332 configured to connect two LEDs 132 and 142 respectively disposed in the third and fourth LED groups 130 and 140 and spaced apart from each other in the second direction D2; and a fourth region 334 configured to connect two LEDs 132 and 142 respectively disposed in the third and fourth LED groups 130 and 140 and spaced apart from each other in the direction that intersects the first direction D1 and the second direction D2. Similar to the first circuit 310, the third and fourth regions 332 and 334 of the third circuit 330 may be alternately disposed.

Therefore, according to the fourth embodiment of the present disclosure, the fourth circuits 340 may branch off from the third and fourth regions 332 and 334 of the third circuit 330 and connect, in a one-to-one manner, the third and fourth regions 332 and 334 to the plurality of FET elements provided in the matrix IC unit 200.

In addition, as in the third embodiment of the present disclosure, according to the fourth embodiment of the present disclosure, the matrix IC unit 200 may include: a first matrix IC 210 spaced apart from the first LED group 110 in a direction opposite to a direction in which the first LED group 110 faces the second LED group 120; and a second matrix IC 220 spaced apart from the third LED group 130 in a direction opposite to a direction in which the third LED group 130 faces the fourth LED group 140. Further, the second circuits 320 may be connected to the FET elements provided in the first matrix IC 210, and the fourth circuits 340 may be connected to the FET elements provided in the second matrix IC 220.

The description of the method of operating and controlling the lamp for a vehicle according to the fourth embodiment of the present disclosure may be replaced with the description of the method of operating and controlling the lamp for a vehicle according to the first to third embodiments of the present disclosure.

Figure 5:
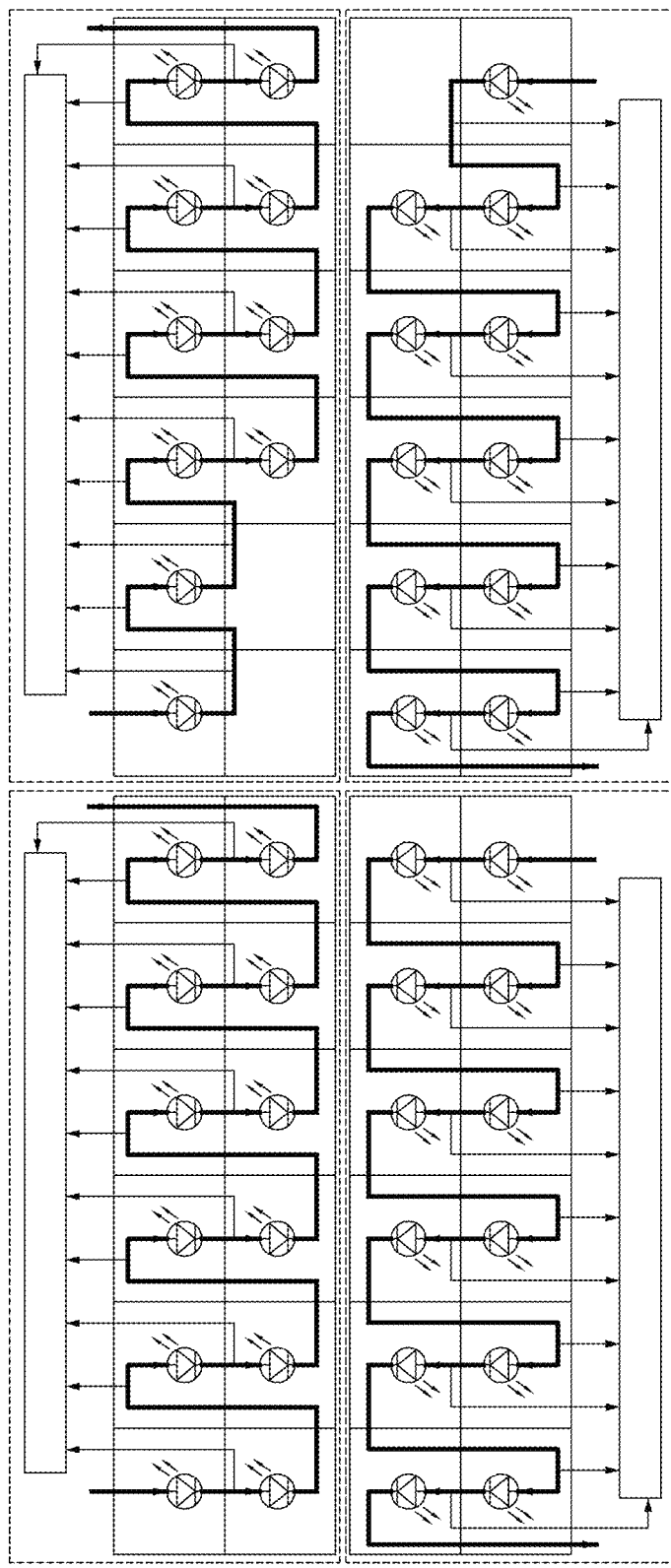
FIG. 5 is a view illustrating a structure of a lamp for a vehicle according to a fifth embodiment of the present disclosure.

FIG. 5 is a view illustrating a structure of a lamp for a vehicle according to a fifth embodiment of the present disclosure.

A lamp 10 for a vehicle according to a fifth embodiment of the present disclosure may have the structure in which at least two of the lamps 10 for a vehicle according to the first to fourth embodiments of the present disclosure are disposed.

FIG. 5 illustrates, as an example, a structure in which the lamps for a vehicle according to the first embodiment are respectively disposed in a left upper region and a left lower region and the lamps for a vehicle according to the second embodiment are respectively disposed in a right upper region and a right lower region. Alternatively, it may be understood that the lamp for a vehicle illustrated in FIG. 5 has a structure in which the lamp for a vehicle according to the fourth embodiment is disposed in a left region, and the lamps for a vehicle according to the second embodiment are respectively disposed in a right upper region and a right lower region.

Meanwhile, although not illustrated in the drawings, the lamp 10 for a vehicle according to the present disclosure may further include a board, and the components of the lamp 10 for a vehicle may be mounted on the board. For example, the board may be a PCB.

Hereinafter, a vehicle according to the present disclosure will be described with reference to the above-mentioned description and the drawings.

Vehicle

The vehicle according to the present disclosure may include the lamp 10 for a vehicle.

In this case, the lamp 10 for a vehicle may include: the first LED group 110 including the plurality of LEDs 112 disposed to be spaced apart from one another in the first direction D1; the second LED group 120 spaced apart from the first LED group 110 in the second direction D2 perpendicularly intersecting the first direction D1 and including the plurality of LEDs 122 disposed to be spaced apart from one another in the first direction D1; the matrix IC unit 200 spaced apart from the first LED group 110 in the second direction D2 and including the plurality of FET elements; the first circuit 310 configured to connect, in series, the plurality of LEDs 112 and 122 disposed in the first and second LED groups 110 and 120; and the second circuits 320 branching off from the first circuit 310 and connected to the FET elements provided in the matrix IC unit 200.

In this case, the first circuit 310 may include: the first region 312 configured to connect the two LEDs 112 and 122 respectively disposed in the first and second LED groups 110 and 120 and spaced apart from each other in the second direction D2; and the second region 314 configured to connect the two LEDs 112 and 122 respectively disposed in the first and second LED groups 110 and 120 and spaced apart from each other in the direction that intersects the first direction D1 and the second direction D2.

Meanwhile, for example, the lamp 10 for a vehicle according to the present disclosure may be an adaptive driving beam (ADB) lamp. In addition, the above-mentioned description of the lamp for a vehicle according to the present disclosure may also be applied to the lamp for a vehicle provided in the vehicle according to the present disclosure.

The present disclosure has been described with reference to the limited embodiments and the drawings, but the present disclosure is not limited thereto. The present disclosure may be carried out in various forms by those skilled in the art, to which the present disclosure pertains, within the technical spirit of the present disclosure and the scope equivalent to the appended claims.

What is claimed is:

1. A lamp for a vehicle, the lamp comprising:
a first LED group comprising a plurality of LEDs spaced apart from one another and aligned in a first direction, wherein each LED of the first LED group is individually controlled from each other only along the first direction;
a second LED group spaced apart from, aligned, and adjacent to the first LED group in a second direction intersecting the first direction and comprising a second plurality of LEDs spaced apart from one another in the first direction, wherein each LED of the second plurality of LEDs is spaced a first distance along the second direction from a respective LED of the first plurality of LEDs, wherein each LED of the second LED group is individually controlled from each other only along the second direction;
a matrix integrated circuit (IC) unit spaced apart from the first LED group in the second direction and comprising a plurality of field effect transistor (FET) elements;
a first circuit configured to connect, in series, the first and second plurality of LEDs in the first and second LED groups, wherein an order of connection alternates between the first plurality of LEDs and the second plurality of LEDs; and
second circuits branching off from the first circuit and connected to the FET elements,
wherein the first circuit comprises:
a first region configured to connect two LEDs respectively in the first and second LED groups and spaced apart from each other in the second direction; and
a second region configured to connect two LEDs respectively in the first and second LED groups and spaced apart from each other in a direction intersecting the first direction and the second direction.

2. The lamp of claim 1, wherein the second circuits branch off from the first and second regions and connect, in a one-to-one manner, the first and second regions to the plurality of FET elements provided in the matrix IC unit.

3. The lamp of claim 1, wherein the first circuit comprises a section in which the first and second regions are alternately disposed.

4. The lamp of claim 3, further comprising:
an additional LED group comprising one or more LEDs and spaced apart from the first LED group in the first direction; and
an additional circuit configured to connect the additional LED group and the first LED group in series.

5. The lamp of claim 4, wherein the additional LED group comprises a plurality of LEDs be spaced apart from one another in the first direction, and the additional circuit connects, in series, the plurality of LEDs in the additional LED group.

6. A vehicle comprising: a lamp for a vehicle, the lamp comprising: a first LED group comprising a plurality of LEDs spaced apart from one another and aligned in a first direction, wherein each LED of the first LED group is individually controlled from each other only along the first direction; a second LED group spaced apart from, aligned, and adjacent to the first LED group in a second direction intersecting the first direction and comprising a second plurality of LEDs spaced apart from one another in the first direction, wherein each LED of the second plurality of LEDs is spaced a first distance along the second direction from a respective LED of the first plurality of LEDs, wherein each LED of the second LED group is individually controlled from each other only along the second direction; a matrix integrated circuit (IC) unit spaced apart from the first LED group in the second direction D2 and comprising a plurality of field effect transistor (FET) elements; a first circuit configured to connect, in series, the first and second plurality of LEDs in the first and second LED groups, wherein an order of connection alternates between the first plurality of LEDs and the second plurality of LEDs; and second circuits branching off from the first circuit and connected to the FET elements, wherein the first circuit comprises: a first region configured to connect two LEDs respectively in the first and second LED groups and spaced apart from each other in the second direction; and a second region configured to connect two LEDs respectively in the first and second LED groups and spaced apart from each other in a direction intersecting the first direction and the second direction.

7. The vehicle of claim 6, wherein the lamp for a vehicle is an adaptive driving beam (ADB) lamp.

\* \* \* \* \*